(12) United States Patent
Kirn

(10) Patent No.: US 7,157,964 B2
(45) Date of Patent: Jan. 2, 2007

(54) MULTI-OUTPUT SWITCHING AMPLIFIER

(75) Inventor: Larry Kirn, East Lansing, MI (US)

(73) Assignee: Jam Technologies, Inc., Boston, MA (US)

( * ) Notice: Subject to any disclaimer, the term of this patent is extended or adjusted under 35 U.S.C. 154(b) by 61 days.

(21) Appl. No.: 10/916,038

(22) Filed: Aug. 11, 2004

(65) Prior Publication Data

US 2005/0068098 A1    Mar. 31, 2005

Related U.S. Application Data

(60) Provisional application No. 60/494,215, filed on Aug. 11, 2003.

(51) Int. Cl.
*H03F 3/38* (2006.01)
*H03F 3/68* (2006.01)

(52) U.S. Cl. ..................... 330/10; 330/124 R

(58) Field of Classification Search .............. 330/10, 330/124 R, 207 A, 251, 295
See application file for complete search history.

(56) References Cited

U.S. PATENT DOCUMENTS

| | | | |
|---|---|---|---|
| 6,593,807 B1 * | 7/2003 | Groves et al. | 330/10 |
| 6,731,162 B1 * | 5/2004 | Yeongha et al. | 330/10 |
| 6,882,222 B1 * | 4/2005 | Honda et al. | 330/207 A |
| 7,058,463 B1 * | 6/2006 | Ruha et al. | 700/94 |

* cited by examiner

*Primary Examiner*—Steven J. Mottola
(74) *Attorney, Agent, or Firm*—Gifford, Krass, Groh, Sprinkle, Anderson & Citkowski, PC

(57) ABSTRACT

Apparatus and methods for driving multiple output stages with a single switching amplification modulator reduce system cost and complexity. The technique also addresses applications wherein one or more of several output stages of potentially differing output powers are desired at one time. That is, the switching drivers and loads can be the same or different.

2 Claims, 1 Drawing Sheet

MULTI-OUTPUT SWITCHING AMPLIFIER

REFERENCE TO RELATED APPLICATION

This application claims priority from U.S. Provisional Patent Application Ser. No. 60/494,215, filed Aug. 11, 2003, the entire content of which is incorporated herein by reference.

FIELD OF THE INVENTION

This invention relates generally to switching amplifiers and, in particular, to the use of a single pulsewidth modulator to drive multiple output stages.

BACKGROUND OF THE INVENTION

High-quality amplifier design through the analog era has largely relied upon feedback to ensure linear operation and mitigate errors introduced at each stage of an amplifier. Although the migration into digital switching amplification has followed the closed-loop design model, newer technologies are becoming available which facilitate high quality open-loop amplification without imposing the cost penalty associated with equivalent analog approaches. In certain application areas, such as distributed amplification, it is possible to leverage the lack of feedback loop complexity into an additional cost saving.

SUMMARY OF THE INVENTION

The present invention resides in apparatus and methods for driving multiple output stages with a single switching amplification modulator, thereby reducing system cost. The technique also addresses applications wherein one or more of several output stages of potentially differing output powers are desired at one time. That is, the switching drivers and loads can be the same or different.

DETAILED DESCRIPTION OF THE INVENTION

Figure 1:
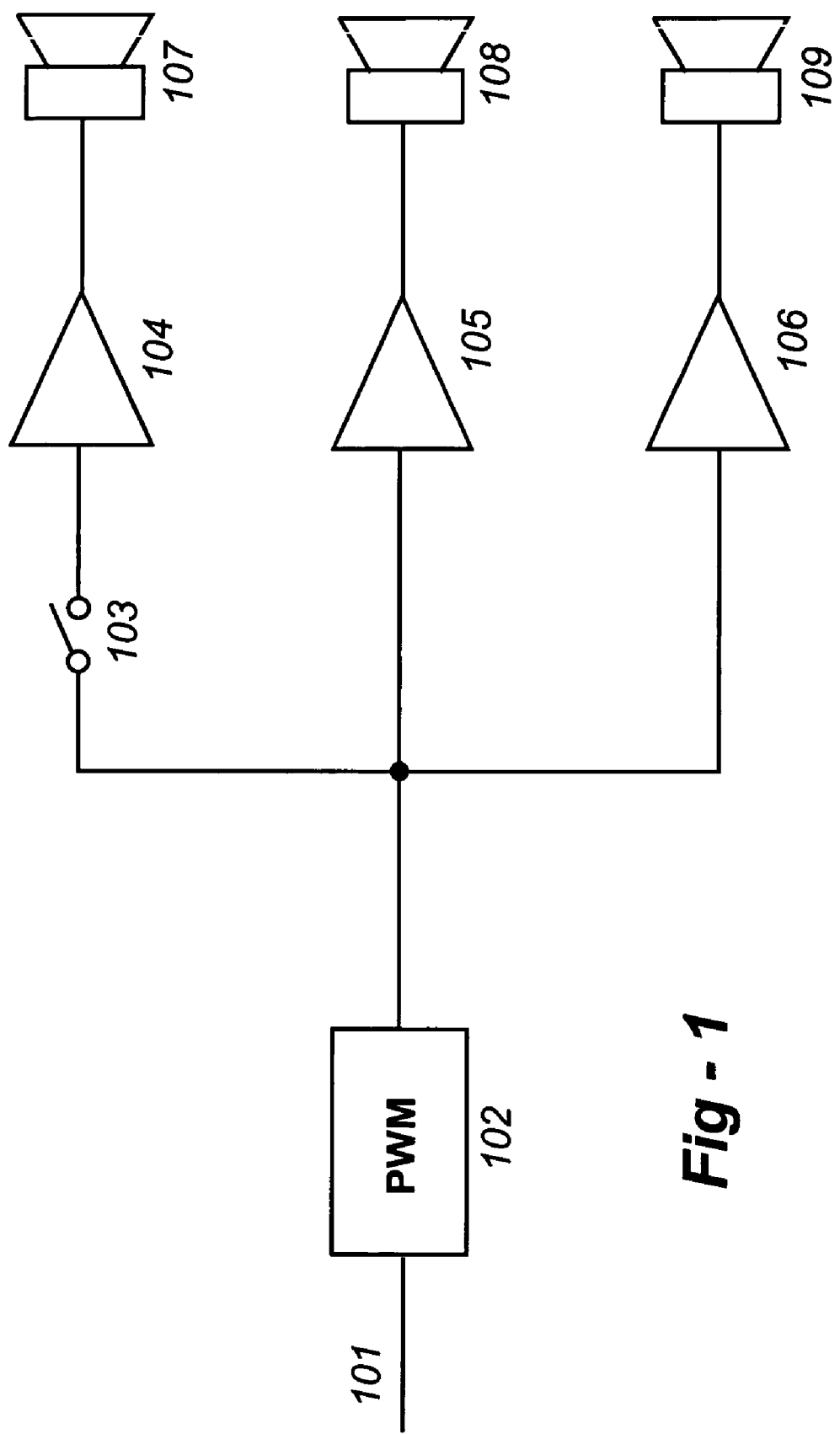
FIG. 1 is a block diagram depicting a preferred embodiment of the invention.

The present invention is a method of driving multiple output stages with a single switching amplification modulator, thereby reducing system cost. FIG. 1 shows a preferred embodiment. Incoming digital data stream 101 is fed to pulsewidth modulator 102, which converts the data stream 101 into pulsewidth modulated signals suitable for driving switching output drivers.

The pulsewidth modulated signals are connected to switch 103 and switching output drivers 105 and 106. The output of switch 103 connects to the input of switching driver 104, making its output optional. The amplified power outputs of switching drivers 104, 105, and 106 are connected to loads 107, 108, and 109, respectively. Thus, a single amplifier modulator can then be seen to drive multiple output stages, thereby reducing system cost. Note that this technique also addresses applications wherein one or more of several output stages of potentially differing output powers are desired at one time. That is, the switching drivers 104, 105, and 106 and loads 107, 108, and 109 can be the same or different.

I claim:

1. A multi-output switching amplifier, comprising:
    a pulsewidth modulator operative to convert an input signal into a pulsewidth-modulated output signal; and
    a plurality or output stages, including output stages of differing output power capabilities, each configured to receive the pulsewidth-modulated output signal and drive a separate load.
2. The multi-output switching amplifier claim 1, including a switched connection to at least one of the output stages.

* * * * *

UNITED STATES PATENT AND TRADEMARK OFFICE
CERTIFICATE OF CORRECTION

PATENT NO. : 7,157,964 B2
APPLICATION NO. : 10/916038
DATED : January 2, 2007
INVENTOR(S) : Larry Kirn It is certified that error appears in the above-identified patent and that said Letters Patent is hereby corrected as shown below:

| Column 2, Line 33, Claim 1 | Reads | Should Read |
|---|---|---|
| | "a plurality or output stages" | --a plurality of output stages-- |

Signed and Sealed this

Twenty-fifth Day of August, 2009

David J. Kappos
*Director of the United States Patent and Trademark Office*